United States Patent [19]
Petersen et al.

[11] Patent Number: 5,296,821
[45] Date of Patent: Mar. 22, 1994

[54] METHOD AND APPARATUS FOR CONTROLLING TRANSIENT RESPONSES IN A POWER AMPLIFIER

[75] Inventors: Michael W. Petersen, Elgin, Ill.; Clark D. Fischbach, Hoffman Estates, both of Ill.

[73] Assignee: Motorola, Inc., Schaumburg, Ill.

[21] Appl. No.: 55,460

[22] Filed: May 3, 1993

[51] Int. Cl.$^5$ .............................................. H03G 3/20
[52] U.S. Cl. ..................................... 330/141; 330/281
[58] Field of Search ............... 330/129, 278, 279, 280, 330/281, 141; 455/116, 126, 127

[56] References Cited

U.S. PATENT DOCUMENTS 5,081,713  1/1992  Miyazaki ............................ 455/126
5,193,223  3/1993  Walczak ............................. 455/126

FOREIGN PATENT DOCUMENTS 1-154614  6/1989  Japan ................................... 330/279

Primary Examiner—Steven Mottola
Assistant Examiner—Tiep Nguyen
Attorney, Agent, or Firm—Timothy W. Markison

[57] ABSTRACT

Controlling transient responses in power amplifiers may be accomplished in the following manner. Upon detecting an output power adjustment request, a reference level is accessed from memory, wherein the reference level is based on a previous output condition that is substantially equal to the requested output condition. From the reference level, a first response time is calculated and supplied to a control circuit of the power amplifier such that the power amplifier operates at a first gain level. When the first response time elapses, the power amplifier operates at a second gain level, where the first gain level is greater than the second gain level.

13 Claims, 3 Drawing Sheets

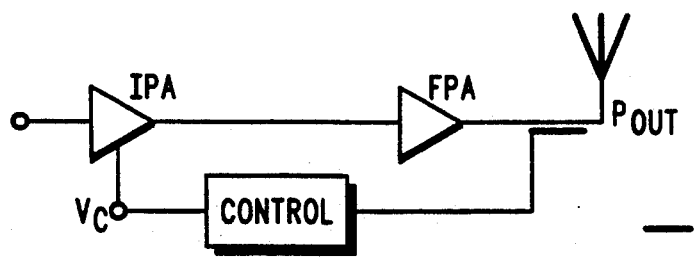
FIG.1
— PRIOR ART —
FIG.2
— PRIOR ART —
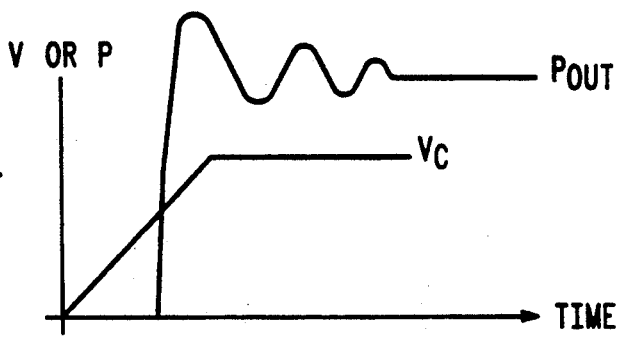
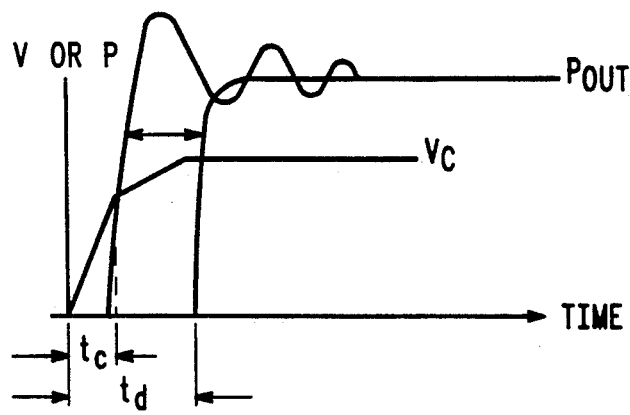
FIG.3
— PRIOR ART —
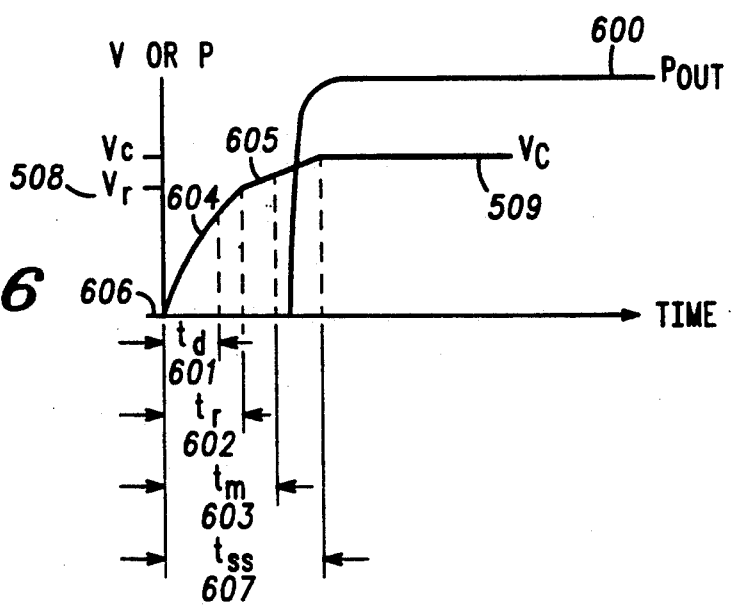
FIG.6

METHOD AND APPARATUS FOR CONTROLLING TRANSIENT RESPONSES IN A POWER AMPLIFIER

FIELD OF THE INVENTION

This invention relates generally to power amplifiers and, in particular, to controlling transient responses in power amplifiers.

BACKGROUND OF THE INVENTION

Power amplifiers are used in transmitters to rebroadcast, at high power levels, amplitude modulation (AM) signals, frequency modulation (FM) signals, and quadrature amplitude modulation (QAM) signals. As is known, information is carried in the amplitudes of AM and QAM signals. Because of this, transmitters must accurately rebroadcast these signals, thus the power amplifiers within the transmitters must have high fidelity, i.e. linearly rebroadcast the signals they receive.

To maintain linear performance, the power elements (usually transistors) are operated at levels much below their rated output power levels. Thus, to achieve high output power levels, many power amplifiers include cascaded elements, such that the amplified output of one element is the input of the next element. In this manner, a small change in a first stage typically produces a large change in the final stage output. For this reason, the power amplifier utilizes a feedback control loop, which is regulated by a power control circuit, to maintain output power levels. See FIG. 1 which illustrates two power elements cascaded together, wherein the power level is controlled by a power control circuit.

To key-up (transmit) or de-key (cease transmitting) a transmitter, a substantial change in the output power level of the power amplifier is required. Federal Communications Commission (FCC) regulations require transmitters to key-up and de-key very quickly while also minimizing splatter on adjacent channels. To accomplish a rapid transmitter power output level adjustment, the control loop enters into a fast mode of operation for a fixed amount of time which is typically set by a capacitor. When the capacitor becomes charged, the loop settles into a slower more stable mode of operation. For a given set of cascaded elements within a given power amplifier, this method works well at fixed temperatures and output power adjustments. However, if any of these parameters change, the same capacitance produces performance fluctuations. As a result, the transient time may be longer and the output power may overshoot to dangerously high power levels. In addition to achieving dangerously high power levels, the overshooting causes splattering on adjacent channels, i.e. interference with adjacent channels. See FIG. 2 which illustrates a prior art timing response of the relationship between the control voltage ($V_C$) and output power ($P_{OUT}$).

To help reduce the overshoot, one prior art solution was to operate the power amplifier at a higher gain level for a fixed time during an output power adjustment. The fixed time was selected to accommodate worst case conditions. Thus, when these worst case conditions were active, the overshoot was minimal. However, when the output adjustments were not worst case, the overshoot returned and the key-up time would vary based on the output adjustment. FIG. 3 illustrates the timing relationship between the control voltage ($V_C$) and output power ($P_{OUT}$). As shown, for the worst case situation, the overshoot was minimal, however the delay time, $t_d$, was excessively long. Alternatively, when the delay time was short, the overshoot was substantial.

Therefore, a need exists for a method and apparatus that controls transient responses of a power amplifier such that the transient time is predictable for a variety of output power adjustments with minimal overshoot.

BRIEF DESCRIPTION OF THE DRAWINGS

FIG. 1 illustrates a prior art apparatus.

FIG. 2 illustrates a prior art timing response.

FIG. 3 illustrates an alternate prior art timing response.

FIG. 6 illustrates timing responses of a power transient controlling apparatus in accordance with the present invention.

DESCRIPTION OF A PREFERRED EMBODIMENT

Generally, the present invention provides a method and apparatus for controlling output responses of an RF (radio frequency) power amplifier. This may be accomplished by detecting a request for an output power adjustment. With an adjustment detected, a power control loop is set to a first, or high, gain level for a calculated response time. When the calculated response time elapses, the power control loop is set to a second, or low, gain level and remains at this level until another output power adjustment is detected. While in this steady-state condition, the RF power amplifier's operating conditions are measured and stored. It is from these stored operating conditions that the calculated response time is determined.

Figure 4:
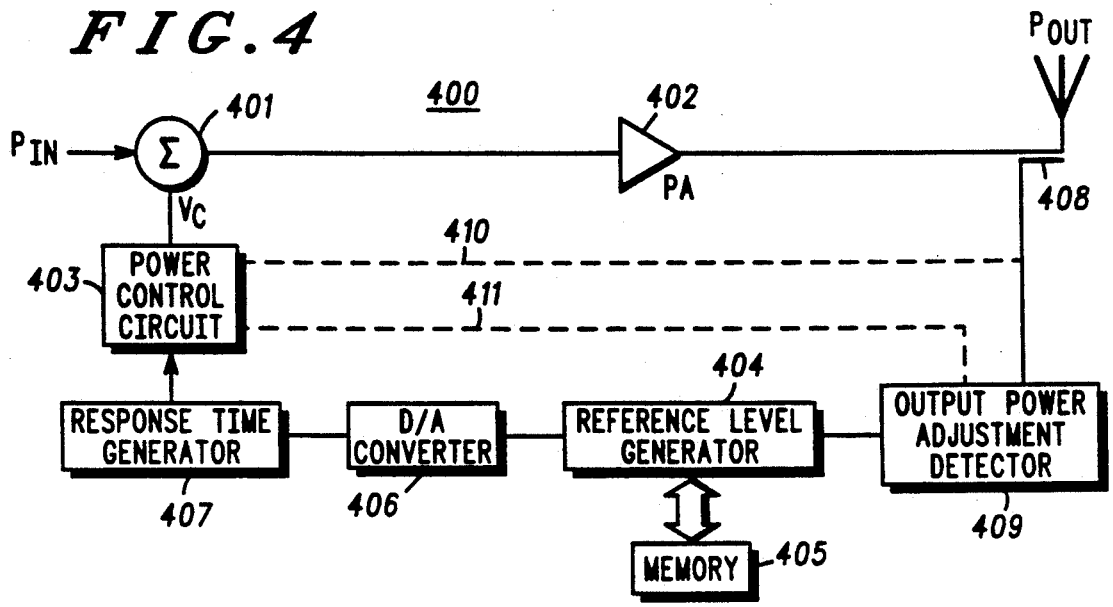
FIG. 4 illustrates an a power transient controlling apparatus in accordance with the present invention.

The present invention can be more fully described with reference to FIGS. 4-8. FIG. 4 illustrates a power amplifier circuit that comprises a summing element 401, a power element 402, a power control circuit 403, a reference level generator 404, a memory device 405, a D/A converter 406, a response time generator 407, an RF power output monitoring device 408, and an output power adjustment detector 409. The RF power output monitoring device 408 may alternatively being connected to the power control circuit 403 via line 410 and the power control circuit 403 may be connected to the output adjustment detector 409 via line 411.

In this embodiment, the output power adjustment detector 409 monitors the output power out of the power element, or transistor, 402 via the RF power output monitoring device 408, which may be a fiber optic coupler, a resistive divider network, or any other circuit that allows the output to be sensed. When an output power adjustment is detected, the output power adjustment detector 409, which may be a multilevel comparator, provides a signal to the reference level generator 404. The reference level generator 404, which may be a microprocessor or a digital processor, utilizes the signal to retrieve a reference level from the memory 405. The reference level is routed to the D/A converter 406 which feeds it to response time generator 407. The response time generator 407, which may be a comparator, calculates a response time based on the analog reference level. The power control circuit 403 utilizes the response time to operate at a first gain level until the response time elapses, then it operates at a second gain level, where the first gain level is greater than the second gain level.

Figure 5:
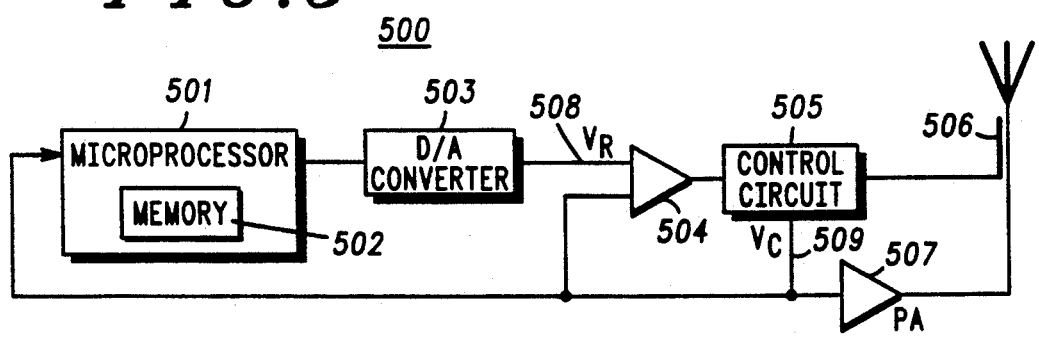
FIG. 5 illustrates an alternate embodiment of a power transient controlling apparatus in accordance with the present invention.

FIG. 5 illustrates an alternate embodiment of the power amplifier circuit 500. In FIG. 5 the power amplifier circuit 500 comprises a microprocessor 501, a memory device 502, a D/A converter 503, a comparator circuit 504, a power control circuit 505, a control signal 509 which controls the power amplifier 507, a detector circuit 506 which detects the output power from the power element 507. The input signal to the power element 507 is controlled by the power control circuit 505 via a control voltage 509. In turn, the control voltage 509 is partially controlled by the reference level voltage 508. A detailed discussion of this circuit will be presented below.

The elements that make up the power amplifier circuit 500 may be conventional devices. For example, the microprocessor 501 may be a Motorola 68HC11 microprocessor; the D/A converter 503 may be any type of D/A converter that is compatible with the microprocessor 501; the comparator circuit 504 may be a comparator chip or an operational amplifier configured as a comparator provided the comparator circuit 504 can determine when the reference voltage 508 and control voltage 509 become equal in magnitude; the power element 507 can be a single or a multiple stage power transistor design; the detector circuit 506 may be a resistive divider network, fiber optic coupler or any device that measures the transmitted power and coverts it into a signal usable by the power control circuit 505; and the power control circuit 505 may be a design composed of multiple parts or it may be a custom chip such as the Motorola custom part 77M73.

The basic functionality of the design is for the microprocessor 501 to access the memory device 502 when a request for power change is initiated. Using the parameters of the change and the information in the memory device 502, the microprocessor 501 programs the D/A converter 503 to produce a reference voltage 508 which is then sent to the comparator circuit 504. The power control circuit 505 then initiates the change in output power via the power element 507 by changing the control voltage. The control voltage 509 not only feeds the power amplifier, but it feeds the comparator circuit 504 and the microprocessor 501. This has the same effect as calculating a response time. The power control circuit 505 operates in a high gain mode until the control voltage 509 is equal in magnitude to the reference voltage 508. At that point the comparator circuit 504 changes state and switches the power control circuit 505 into a slower mode. The power output detector 506 is used by the power control circuit 505 to determine if the output power is at the desired level and, once it is there, maintains the output power level until another output power adjustment, or change, is detected.

FIG. 6 illustrates timing responses of the power amplifier circuit 400 or 500. One feature of the present invention is to minimize $t_{ss}$ (607) (the time it takes to achieve a steady state condition) while insuring that Pout (output power) (600) does not overshoot its steady-state value under any operating conditions. Referring to the prior art, it is seen that a given control loop may suffer from Pout overshoot and ringing, FIG. 2. In addition, the prior art may suffer from excessively long transient times $t_d$, FIG. 3.

When a request for output power adjustment is detected, $t_r$ (response time) (602) is determined. The time $t_r$ is a function of the steady-state Vc(509) and the gain G1(604). [Vc (509) is a function of a variety of factors, among these are temperature, RF power amplifier load, and time.] The steady-state Vc is obtained from a previous output condition that is substantially equal to the present requested output power adjustment and G1(604), which is fixed. Once $t_r$ is determined, the control voltage (509) begins to increase at a relatively fast rate, G1 (604). This aids in achieving a "low" $t_{ss}$ value. After $t_r$ (602) has expired, the control voltage (509) changes its rate of increase to a reduced gain mode, G2 (605). This aids in controlling Pout overshoot.

The voltage level at which the control voltage (509) changes its rate of increase corresponds to the value of the reference voltage (508). The control voltage (509) increases until the power output (600) has reached its desired level. This is the definition of $t_{ss}$ (607). After Pout (600) and Vc (509) have reached a steady-state value, a digital representation of these levels are read and stored. This stored information will be used to determine a future $t_r$ value for any substantially equal output condition requests. The stored information is updated at regular time intervals to monitor any environmental changes to a given power amplifier.

If the present requested output power adjustment has not been requested before, i.e. there are no substantially equal previous output conditions stored, a default time, $t_d$ 601, may be used. This is not the optimal value to achieve the best key-up response and is used only if no other information is available. When the default time is used, some overshooting may result, as well as delays in the time to achieve a steady state condition.

To assure error free operation, a limit is attached to the maximum value of the response time $t_m$ (603), for example, 200 milliseconds. This puts a limit on how large $t_r$(602) may get. It should be noted that this procedure applies when a power change is requested from one power level to another, i.e. the first power level, P1 (606), need not be zero. For example, it may be 50 watts and the requested output power adjustment is 100 watts. Regardless of the initial power level, the timing diagram is identical for any positive power change.

Figure 7:
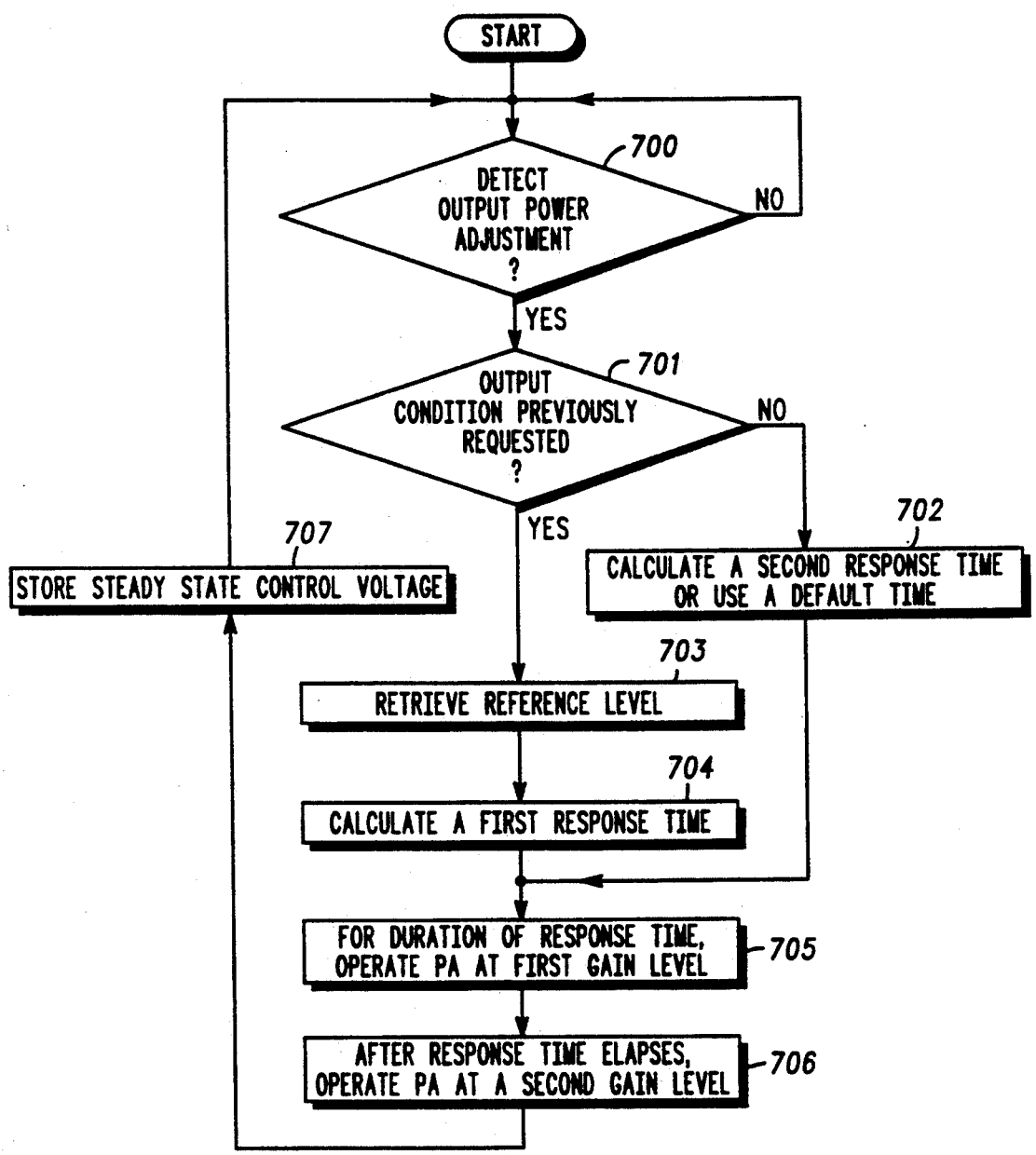
FIG. 7 illustrates a logic diagram that may be used to implement the present invention.

FIG. 7 illustrates a logical diagram that the microprocessor 501 may use to implement the present invention. At step 700, a request for a power output adjustment is detected. A power output adjustment may result from a change in carrier frequencies, temperature, aging, or RF load (increase the output power requirements). This request is initiated by a communication system in which a repeater, or communication unit, that incorporates the invention is implemented. For example, a push-to-talk request, which is initiated by a communication unit, requires the power amplifier to increase its output power level. An alternative example is changing the communication channel, i.e. change the carrier frequency, which can be initiated by the communication unit. In either example, the repeater will have to make an output power adjustment to accommodate the communication unit.

At step 701 the memory device is addressed to request a history of previous output conditions that have been requested to determine if any of the previous output conditions are substantially equal to the presently requested output power adjustment. A previous output condition is substantially equal if the presently requested output power adjustment is within Z % of the previous output condition, where Z is determined by the characteristics of the RF power amplifier. For example, Z may be 20. This applies not only for output power level adjustments, but to frequency changes, temperature changes, and aging of the power amplifier circuit.

If the requested power level is substantially equal to a previous power level 701, a first reference level is retrieved from memory 703. The first reference level is related to the control voltage Vc that was applied to the RF power amplifier for the previous output condition that was retrieved. For example, the reference level may be 80% of Vc, where Vc is measured during steady state condition of the previous output condition.

At step 704 the first reference level is used to calculate the first response time. This is physically realized by calculating a first response time control voltage. The first response time control voltage is a function of the reference level and frequency of operation. This function can be expanded to include ambient temperature, the power amplifier RF load, and/or operating DC voltage. For example, the response time may be 50 mSec by selecting an R-C (resistor-capacitor) circuit that ramps up to the reference level in this amount of time.

If the requested power level is not substantially equal to a previous power level 701, a second reference level is obtained in one of two manners 702. First, the second reference level is extrapolated from at least one existing previous output condition stored in memory. This can be done by determining the difference between the present output power request and the previously stored output condition. Because the power amplifier circuit operates primarily in a linear mode, the second reference level is linearly proportional to the reference level of the previous output condition based on the difference between the present request and the previously stored output condition. The second approach is to use a default reference level. The second, or default, reference level is used to calculate the first response time, as discussed above. In practice, the only time the default reference level will be used is when there are no previous output conditions stored in memory.

At step 705, the control loop is operated at the first gain level for the duration of the first response time. The first gain level is of a high value which results in short rise times and is typically chosen to be the maximum gain that the power amplifier circuit can operate at and still be stable. When the first response time expires, the control loop is switched to a second gain level 706. The second gain level is less than the first gain level and is chosen for optimal stabilization of the power amplifier circuit.

At step 707, after the control loop has reached a steady-state condition, the steady-state control voltage $V_c$ is stored as well as the requested output power condition. In addition, a reference level is calculated from Vc and stored in the memory device. These values can be used as previous output conditions for future output power adjustments. While the power amplifier circuit is in a steady state condition, step 707 is repeated at regular time intervals. This allows for any changes in steady state operating conditions to be reflected in the stored information.

Figure 8:
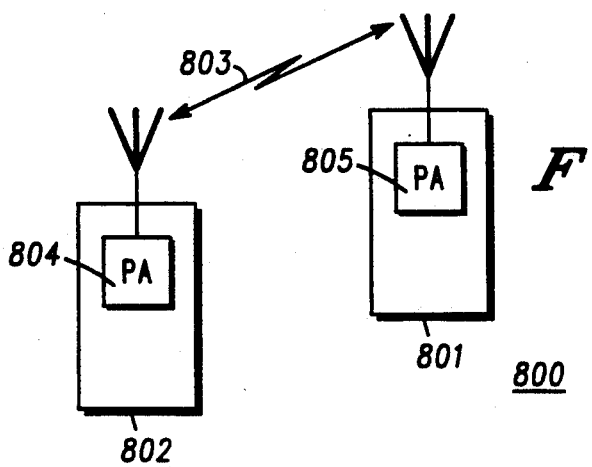
FIG. 8 illustrates a communication system that utilizes power amplifiers in accordance with the present invention.

FIG. 8 illustrates a communication system 800 that comprises a communication unit 802 and a repeater, or base-station, 801. The communication unit may comprise any portable/mobile two-way radio, or paging radio receiver. The repeater, or base-station is a fixed radio unit. Either or both units may contain an RF power amplifier, 804 and 805 that incorporate the present invention.

The present invention solves various problems encountered in the prior art. The prior art, FIG. 1, is capable of matching the performance of this invention under a very specific set of given conditions, i.e. a given frequency, steady state power level, environmental conditions, and a given RF power amplifier unit. However, as any or all of these conditions are perturbed from this given value, the prior art is subject to a variety of undesirable conditions as illustrated in FIG. 2 and FIG. 3. The prior art is subject to power output overshoots and/or excessive transient times $t_d$ (FIG. 3). These undesirable conditions may result in amplifier failure or poor communication system performance. The present invention is capable of reacting to these unpredictable perturbations by monitoring their change. Any change in conditions that is detected results in compensation being applied to the control loop. The result of this is that the transient time $t_d$ is controlled to a near minimum value and this value is maintainable over a wide perturbation of conditions. In addition, this near minimum transient time is maintained with the control loop remaining in a critically or overdamped condition.

We claim:

1. In a power amplifier, a method for controlling transient responses, the method comprises the steps of:
   a) detecting when an output power adjustment is requested to produce a requested output condition;
   b) accessing a memory device for a reference level, wherein the reference level is based on a previous output condition that is substantially equal to the requested output condition;
   c) when the reference level is retrieved from the memory device, calculating a first response time based on the reference level;
   d) supplying the first response time to a control circuit of the power amplifier to operate the power amplifier at a first gain level; and
   e) when the first response time elapses, operating the power amplifier at a second gain level, wherein the first gain level is greater than the second gain level.

2. The method of claim 1 further comprises the steps of:
   f) when the reference level is not retrieved from the memory device due to the requested output condition not being substantially equal to any previous output conditions, accessing the memory device for at least one reference level, wherein the at least one reference level is based on a first previous output condition, wherein the first previous output condition is not substantially equal to the requested output condition;
   g) calculating a second response time based on the at least one reference level and difference between the requested output condition and the first previous output condition;

h) supplying the second response time to the control circuit of the power amplifier to operate the power amplifier at the first gain level; and i) when the second response time elapses, operating the power amplifier at the second gain level.

3. The method of claim 1 further comprises the steps of:

f) when the reference level is not retrieved from the memory device due to the requested output condition not being substantially equal to any previous output conditions, accessing the memory device for a default reference level;

g) calculating a second response time based on the default reference level;

h) supplying the second response time to the control circuit of the power amplifier to operate the power amplifier at the first gain level; and i) when the second response time elapses, operating the power amplifier at the second gain level.

4. In the method of claim 1, step (a) further comprises detecting the output power adjustment based on a power level change.

5. In the method of claim 1, step (a) further comprises detecting the output power adjustment based on a frequency change.

6. The method of claim 1 further comprises the step of storing in the memory device a steady state control voltage of the control circuit as the reference level for the requested output condition, such that, when the requested output condition is requested again, there is a previous output condition that is substantially equal.

7. An apparatus for controlling transient responses in a power amplifier, the apparatus comprises:

an output power adjustment detector, wherein the output power adjustment detector detects when an output power adjustment is requested to produce a requested output condition;

a reference level generator, wherein the reference level generator generates a reference level based on a previous output condition that is substantially equal to the requested output condition;

a memory device operably coupled to the reference level generator, wherein the memory device stores the reference level;

a digital to analog convertor, operably coupled to the reference level generator, wherein the digital to analog convertor converts the reference level to an analog signal;

a response time generator operably coupled to the digital to analog convertor, wherein the response time generator generates a response time based on a difference between a control voltage and the analog signal, wherein the control voltage controls the gain level of the power amplifier; and a power control circuit operably coupled to the power amplifier and the response time generator, wherein the power control circuit operates the power amplifier at a first gain level for duration of the response time and operates the power amplifier at a second gain level after the response time elapses, wherein the first gain level is greater than the second gain level.

8. In a base station that contains a power amplifier, a method for controlling transient responses in the power amplifier, the method comprises the steps of:

a) detecting when an output power adjustment is requested to produce a requested output condition;

b) accessing a memory device for a reference level, wherein the reference level is based on a previous output condition that is substantially equal to the requested output condition;

c) when the reference level is retrieved from the memory device, calculating a first response time based on the reference level;

d) supplying the first response time to a control circuit of the power amplifier to operate the power amplifier at a first gain level; and e) when the first response time elapses, operating the power amplifier at a second gain level, wherein the first gain level is greater than the second gain level.

9. The method of claim 8 further comprises the steps of:

f) when the reference level is not retrieved from the memory device due to the requested output condition not being substantially equal to any previous output conditions, accessing the memory device for at least one reference level, wherein the at least one reference level is based on a first previous output condition, wherein the first previous output condition is not substantially equal to the requested output condition;

g) calculating a second response time based on the at least one reference level and difference between the requested output condition and the first previous output condition;

h) supplying the second response time to the control circuit of the power amplifier to operate the power amplifier at the first gain level; and i) when the second response time elapses, operating the power amplifier at the second gain level.

10. The method of claim 8 further comprises the steps of:

f) when the reference level is not retrieved from the memory device due to the requested output condition not being substantially equal to any previous output conditions, accessing the memory device for a default reference level;

g) calculating a second response time based on the default reference level;

h) supplying the second response time to the control circuit of the power amplifier to operate the power amplifier at the first gain level; and i) when the second response time elapses, operating the power amplifier at the second gain level.

11. In a radio that contains a power amplifier, a method for controlling transient responses in the power amplifier, the method comprises the steps of:

a) detecting when an output power adjustment is requested to produce a requested output condition;

b) accessing a memory device for a reference level, wherein the reference level is based on a previous output condition that is substantially equal to the requested output condition;

c) when the reference level is retrieved from the memory device, calculating a first response time based on the reference level;

d) supplying the first response time to a control circuit of the power amplifier to operate the power amplifier at a first gain level; and e) when the first response time elapses, operating the power amplifier at a second gain level, wherein the first gain level is greater than the second gain level.

12. The method of claim 11 further comprises the steps of:

f) when the reference level is not retrieved from the memory device due to the requested output condition not being substantially equal to any previous output conditions, accessing the memory device for at least one reference level, wherein the at least one reference level is based on a first previous output condition, wherein the first previous output condition is not substantially equal to the requested output condition;

g) calculating a second response time based on the at least one reference level and difference between the requested output condition and the first previous output condition;

h) supplying the second response time to the control circuit of the power amplifier to operate the power amplifier at the first gain level; and i) when the second response time elapses, operating the power amplifier at the second gain level.

13. The method of claim 11 further comprises the steps of:

f) when the reference level is not retrieved from the memory device due to the requested output condition not being substantially equal to any previous output conditions, accessing the memory device for default reference level;

g) calculating a second response time based on the default reference level;

h) supplying the second response time to the control circuit of the power amplifier to operate the power amplifier at the first gain level; and i) when the second response time elapses, operating the power amplifier at the second gain level.

* * * * *